United States Patent [19]

Jansen et al.

[11] Patent Number: 5,204,210
[45] Date of Patent: Apr. 20, 1993

[54] METHOD FOR THE DIRECT PATTERNING OF DIAMOND FILMS

[75] Inventors: Frank Jansen; Mary A. Machonkin, both of Webster, N.Y.

[73] Assignee: Xerox Corporation, Stamford, Conn.

[21] Appl. No.: 624,031

[22] Filed: Dec. 7, 1990

[51] Int. Cl.$^5$ .................... G03C 11/00; B05D 3/02
[52] U.S. Cl. .................... 430/198; 430/350; 430/330; 427/228; 427/249; 427/402; 427/558
[58] Field of Search .............. 430/330, 325, 198, 350; 427/38, 99, 249, 255.2, 259, 402, 228

[56] References Cited

U.S. PATENT DOCUMENTS

| | | | |
|---|---|---|---|
| 2,900,255 | 8/1959 | Charlton | 430/198 |
| 3,317,319 | 5/1967 | Mayaud | 430/330 |
| 3,443,944 | 5/1969 | Wise | 430/198 |
| 3,481,733 | 12/1969 | Evans | 430/198 |
| 3,637,385 | 1/1972 | Hayes et al. | 430/330 |
| 3,754,912 | 8/1973 | Jones et al. | 430/330 |
| 3,958,996 | 5/1976 | Inskip | 430/198 |
| 3,982,941 | 9/1976 | Inskip | 430/198 |
| 4,104,441 | 8/1978 | Fedoseev et al. | 427/249 |
| 4,410,611 | 10/1983 | MacIver et al. | 427/38 |
| 4,529,860 | 7/1985 | Robb | 430/330 |
| 4,554,208 | 11/1985 | MacIver et al. | 427/38 |
| 4,613,560 | 9/1986 | Dueber et al. | 430/198 |
| 4,618,505 | 10/1986 | MacIver et al. | 427/38 |
| 5,006,203 | 4/1991 | Purdes | 427/38 |

FOREIGN PATENT DOCUMENTS 1-162757  6/1989  Japan .................... 427/249

OTHER PUBLICATIONS

J. C. Angus et al., "Growth of Diamond Seed Crystals by Vapor Deposition", vol. 39, May 1968, 2915-2922.

*Primary Examiner*—Charles L. Bowers, Jr.
*Assistant Examiner*—Martin Angebranndt
*Attorney, Agent, or Firm*—Kenyon & Kenyon

[57] ABSTRACT

A method of forming a patterned, poly-crystalline diamond film on a substrate is disclosed. First, a photoresist layer is applied to a substrate. A diamond powder layer is formed on the photoresist layer either through spray-coating, dip-coating, spin-coating using a diamond-powder suspension, and the like. The photoresist layer is exposed to electromagnetic radiation through a mask either before or after the diamond powder layer is applied. Then, the photoresist layer is developed, after which the substrate is heated causing the photoresist layer to carbonize. The substrate is exposed to a mixture of hydrogen-containing and carbon-containing gases which are decomposed in a processing apparatus. Hydrogen in this gas mixture etches away at the carbonized photoresist layer leaving behind the patterned diamond powder layer. Carbon in these carbon-containing gases combines with the diamond particles in the diamond powder layer to form diamond structures on the substrate.

23 Claims, 3 Drawing Sheets

METHOD FOR THE DIRECT PATTERNING OF DIAMOND FILMS

BACKGROUND OF THE INVENTION

The present invention pertains to thin-film patterning, and more particularly to the patterning of diamond film on a substrate.

Diamond thin films have a variety of uses such as razor blades, tool bits, and surgical instruments, especially in neurosurgery, where diamond thin films have been used in scalpels. Because of its excellent heat conduction properties, diamond thin films have been used in heat-sink applications such as heat conductive coatings in microelectronic components.

A number of methods have been employed for forming a diamond thin film on a substrate in connection with the uses described above. For example, U.S. Pat. No. 4,740,263 discloses the forming of a diamond film on a semiconductor surface using electron assisted chemical vapor deposition (EACVD). In this method, the semiconductor substrate is heated and bombarded with electrons in a hydrocarbon gas to produce nucleation sites on the substrate surface. A similar method is disclosed in U.S. Pat. Nos. 4,830,702 and 4,842,945.

In U.S. Pat. Nos. 4,844,785 and 4,919,974, a diamond film is formed by impinging carbon particles onto a substrate at a high temperature. In U.S. Pat. No. 4,869,923, a nitrogen compound and a carbon compound are placed in a reaction chamber with a semiconductor substrate. The nitrogen compound assists in adhering carbon particles to the substrate surface.

In "Ion-Beam-Assisted Etching of Diamond" by N. N. Efremow, M. W. Geis, D. C. Flanders, G. A. Lincoln, and N. P. Economou, *J. Vac. Sci. Technol. B*3 (1985), there is a lengthy discussion of an unconventional method of etching a single crystalline diamond layer with xenon and nitrogen dioxide to make desired patterns. Although effective, this technique tends to be cumbersome. Conventional reactive ion etching (RIE) with oxygen, also mentioned in the paper, tends to be slow. As a further complication for polycrystalline diamond, the etching rate differs for each energy for the various faces of the diamond lattice.

One of the more common methods is discussed in *Selective Deposition of Diamond Films* by J. L. Davidson et al. (Elec. Eng. Dept. of the Alabama Microelectronics Science and Technology Center, Auburn Univ.). The method of this article employs the deposition of diamond films on a "scratched" surface of a silicon substrate. Initially, a polished silicon substrate surface is scratched by a diamond paste. After a cleaning step, a layer of silicon nitride is then formed on the scratched surface and patterned using standard photolithographic processes. Then, exposed silicon is oxidized and the remaining silicon nitride is removed, leaving areas of scratched silicon substrate exposed. A carbon-bearing gas, such as methane, is decomposed near the substrate in a manner which permits carbon radicals of the gas to adhere to the scratched silicon surface, more so than to a smooth silicon surface.

Although scratches in the silicon surface provide nucleation sites for diamond growth, the diamond growth does not always occur. Also, after initially scratching the silicon surface, some particles in the diamond paste are left behind, even after cleaning, forming unwanted nucleation sites. Small particles of any material having a high surface energy can act as nucleation centers. This scratching method is believed to be inadequate for optical substrates and unfeasible for microelectronic substrates which already contain circuitry.

Patterned diamond thin films have been found to be particularly amenable to uses in microelectronic applications. Since diamond structures have such good heat conduction properties, patterned diamond thin films can be used as heat sinks in microelectronic circuitry. Also, non-continuous diamond thin films negate stress components in a semiconductor wafer arising from differential thermal expansion and intrinsic stress.

A problem with the processes noted above is that the forming of diamond thin films on a substrate can not often be accomplished in an economically efficient manner. Also, it is often difficult to form diamond structures in specific areas particularly in a microelectronic environment where space is at a premium.

SUMMARY OF THE INVENTION

The invention relates to a method of direct patterning of diamond thin films that overcomes the deficiencies noted above. In connection with microelectronic circuitry, a photoresist layer is initially formed on a substrate. After a diamond powder layer is formed on this photoresist layer, the photoresist is exposed to electromagnetic radiation through a mask. The photoresist layer is then developed, thus patterning the photoresist layer and effectuating a removal of diamond powder in certain areas. The substrate is then placed in a processing apparatus and heated, causing it to carbonize. A mixture of hydrogen-containing and carbon-containing gases are introduced into the processing apparatus and decomposed. Hydrogen in this mixture reacts with the carbonized photoresist layer to effect removal of this layer, leaving a patterned diamond powder layer on the substrate. In this manner the decomposed gases permit the application of diamond structures on the substrate in the patterned areas.

In an alternate embodiment of the invention, the photoresist layer is exposed to electromagnetic radiation before the application of the diamond layer. The diamond layer can be applied by such methods as dip-coating, spray-coating, or spin-coating a suspension of diamond particles. A continuous diamond film can be formed on the substrate using the method of the present invention by forgoing the exposing and development of the photoresist layer.

An advantage of the present invention is that diamond thin films can be disposed on semiconductor wafers and components without damaging the semiconductor surface. Also, the method of the present invention is believed to be simpler and more economical than previous diamond deposition methods. Furthermore, the present invention is believed to allow better control of the placement of diamond thin layers on a substrate surface.

The above is a brief description of some deficiencies in disclosed diamond thin film methods and advantages of the present invention. Other features, advantages and embodiments of the invention will be apparent to those skilled in the art from the following description, accompanying drawings and appended claims.

DETAILED DESCRIPTION

Figure 1A:
FIGS. 1a-f are enlarged cross-sectional views of the formation of diamond structures on a substrate according to an embodiment of the present invention.

In the drawings, like reference numerals have been used throughout to designate identical elements. Referring to FIG. 1, a method of the present invention is shown. Substrate 1 as shown in FIG. 1a, can be formed from standard semiconductor material such as silicon, germanium, gallium-arsenide, and the like. Substrate 1 can also be formed from steel or other materials which are more suitable for instrument applications such as surgical devices or razor blades. Since the substrate 1 can have a variety of forms and sizes, the thickness dimensions of the substrate are not important. Although substrate is described in connection with planar objects such as a semiconductive wafer, the substrate can be three-dimensional objects such as a tool bit or an optical device. In the present embodiment, substrate 1 is formed from silicon in a known method familiar to those in the semiconductor arts. Rather than abrading the surface of the substrate as in previous methods, the surface is kept as smooth as possible as in standard photolithographic processes.

Figure 1B:
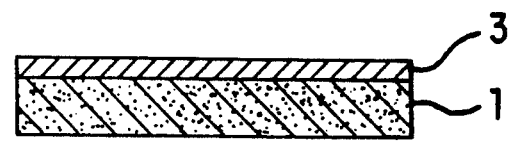

Referring to FIG. 1b, the substrate 1 is then coated with any of a variety of positive or negative photoresists. The photoresist layer 3 can be, for example, positive KTI photoresist (820, 27cs), which is generally available. Photoresist layer 3, is formed on substrate 1 by pouring the photoresist onto substrate until the latter is completely covered, then spinning the substrate in a spin-coater at a high speed, such as 5,000 R.P.M., for approximately one minute. The substrate 1 and photoresist layer 3 combination is then baked at 90° C. for approximately 15 minutes. The thickness of the photoresist layer 3 can be from 0.5 to 10 microns, and preferably between 1 and 2 microns.

Figure 1C:
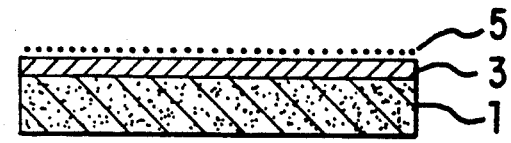

Referring to FIG. 1c, a diamond powder layer 5 is disposed onto the photoresist layer 3. There are several different possible methods for forming the diamond powder layer 5. A crude method would be to sprinkle dry diamond particles onto the photoresist layer 3. In this method, diamond particles can be sifted through a fine wire mesh. A more elaborate method is the use of electrostatic development. These dry methods may result in the clumping of particles together and give unsatisfactory results. Alternatively, diamond particles can be suspended in a solution, such as an alcohol. In this embodiment, diamond particles should have an average diameter of 0.01 to 0.4 microns. For instance, 0.1 micron particles can be obtained in bulk having a diameter ranging from 0.05 to 0.25 microns. A suspension can be made by taking 8 mg of 0.1 micron diamond particles and adding 4 ml isopropanol. This solution is then agitated using a microsonic stylus for approximately two minutes. The solution is then added to the substrate immediately to prevent settling of the suspension. The suspension can be applied to the photoresist layer using several processes. The suspension can be applied by dipping the substrate 1 and photoresist layer 3 combination into the suspension. This procedure is more commonly referred to as dip-coating. Secondly, the suspension can be sprayed directly onto the photoresist layer 3. Dip-coating and spray-coating are more appropriate when the substrate is not flat as it invariably is in such processes as integrated circuit chip fabrication. A third process for forming the diamond powder layer 5, is by spin-coating. The diamond powder suspension is gently poured over the substrate 1 and photoresist layer 3 combination. The substrate 1 is then spun at a fast rate, for example 3,000 R.P.M., for approximately 30 seconds in a spin-coater. Spin-coaters are well-known in the art and common in most photolithographic processes. Because the substrate 1 is spun rather quickly, the isopropanol in the diamond powder suspension evaporates leaving the diamond powder layer 5. The diamond particles tend to be evenly disposed on the photoresist layer 3. In this embodiment, the distribution of diamond particles tends to be one to ten particles per square micron. Also, the diamond particles tend to adhere well to the surface of the photoresist layer 3. The entire structure is then soft baked at 90° C. for approximately 15 minutes.

Figure 1D:
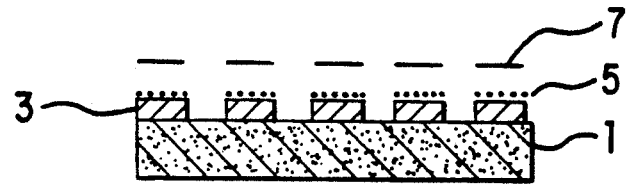

Referring to FIG. 1d, the forming of specific structures in the photoresist layer 3 and diamond powder layer 5 is shown. A mask 7 or similar device is placed above the diamond powder layer 5. The mask 7 selectively allows electromagnetic radiation, such as visible light, pass through in certain areas, as is well known in the art. The mask 7 is exposed to Ultra-Violet (UV) light for an appropriate amount of time. The diamond powder layer 5 and the photoresist layer are, thus, partially exposed to the UV light. The photoresist layer 3 is then developed in any of a variety of well known methods. For example, the substrate 1 can be spun while applying KTI 809 3:1 developer for 24 seconds from a nozzle (not shown) directly over the diamond powder layer 5 and photoresist layer 3. The entire structure can then be rinsed with distilled water from a nozzle (not shown) directly over the diamond powder layer 5 and photoresist layer 3. Diamond particles that were present on top of those parts of the photoresist layer 3 that were exposed to the UV light are removed during this lift-off process.

Figure 1E:

Referring to FIG. 1e, the removal of the patterned photoresist layer 3 is shown. After the photoresist layer has been developed, the entire structure is placed into a processing apparatus, such as a deposition chamber, and heated to a high temperature, such as 400°-900° C. This heating step has the effect of carbonizing the photoresist layer 3. Then, during the deposition of diamond, the deposition chamber is subjected to a vacuum, preferably 1 mTorr to 10 mTorr. Hydrogen-containing gas, such as diatomic hydrogen, is introduced into the chamber at a flow rate preferably between 100 and 1,000 sccm and the pressure brought to 20-60 Torr. This hydrogen gas, when decomposed by a hot filament or plasma, will react with and etch away the carbonized photoresist layer 3 within a few minutes time, leaving the diamond powder layer 5.

Figure 1F:
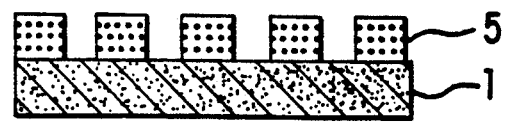

Referring to FIG. 1f, the building of diamond structures on the substrate 1 is shown. The diamond deposition process is generally shown in U.S. Pat. No. 4,925,701 to Jansen et al. which is incorporated herein by reference in its entirety. Briefly, a carbon containing gas or vapor such as methane, ethane, ethylene, acetylene, ethanol, and the like is injected with the hydrogen gas as mentioned in the description of FIG. 1 e. The concentration of the carbon containing gas is preferably between 0.1 to 3 percent by volume than that of the hydrogen gas. The gas mixture is brought to a total pressure of preferably between 20 and 60 Torr. The gas mixture is decomposed in the deposition chamber by, for example, passing the gas mixture over a hot filament having a temperature preferably between 1800°-2100° C., or by the application of a microwave plasma. This mixture can be brought in contact with the substrate 1. The diamond powder layer 5, serves as a multitude of nucleation or seeding areas, and thus, diamond growth occurs in only the patterned areas where diamond powder remains on the surface of the substrate 1.

Other methods of decomposing gas mixtures in diamond deposition procedures are well known to those skilled in the art, reference publication by S. Matsumoto, Y. Sato, M. Tsutsumi, N. Setaka, *J. Mat. Sci* 17 (1982) 3106; by M. Kamo, Y. Sato, S. Matsumoto, N. Setaka, *J. Crystal Growth* 62 (1983) 642; by H. Kawarada, K. S. Mar, A. Hiraki, *Jpn. J. Appl. Phys.* 26 (1987)L 1032; by K. Kurihara, K. Sasaki, M. Kawarada, N. Koshino, *Appl. Phys. Lett.* 52 (1988) 437; and by M. Murakawa, S. Takeuchi, Y. Hirose, *Surface and Coatings Technology* 39/40 (1989) 235, the disclosure of which are totally incorporated herein by reference. These different methods for the decomposition of gases all yield essentially the same end result and only differ by the time period that is needed to deposit a film of a desired thickness.

Figure 2A:
FIGS. 2a-f are enlarged cross-sectional views of the formation of diamond structures on a substrate according to another embodiment of the present invention.
Figure 2B:
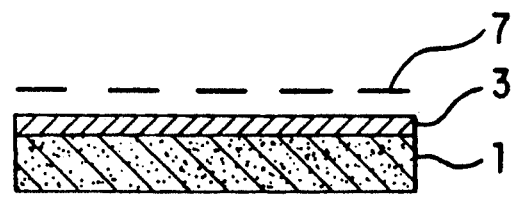
Figure 2C:
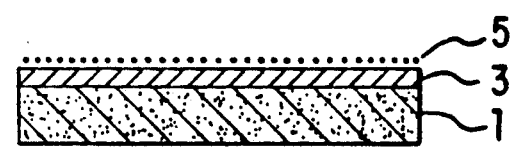
Figure 2D:
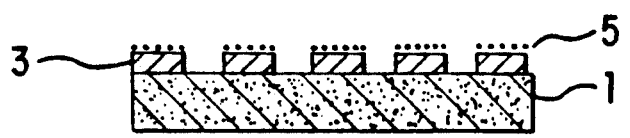
Figure 2E:
Figure 2F:
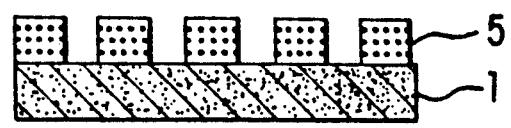

Another embodiment of the present invention is shown in FIGS. 2a-f. The method of forming diamond structures on a substrate is similar to that shown in FIGS. 1a-f. The methods differ as to when the diamond powder layer is formed on the substrate. A substrate 1 is shown in FIG. 2a. The substrate is then coated with photoresist to form photoresist layer 3 and soft baked at 90° for 15 minutes, as shown in FIG. 2b. A mask 7 is placed over the photoresist layer 3, and the photoresist layer 3 is exposed to electromagnetic radiation, such as Ultra-Violet light, through the mask 7, for a period of time. Referring to FIG. 2c, a diamond powder layer 5 is then added to the exposed photoresist layer 3. As seen in FIG. 2d, the photoresist layer 3 is then developed, thus removing parts of the diamond powder layer 5 in areas where the photoresist layer 3 is developed. The substrate is then placed in a processing apparatus, such as a deposition chamber, and exposed to a high temperature which carbonizes the photoresist layer 3. The substrate 1 is then exposed to a mixture of hydrogen-containing and carbon-containing gases at a high temperature and reduced pressure. The hydrogen-containing gas when decomposed by a hot filament or microwave plasma etches away the carbonized photoresist layer 3. The combination of hydrogen and carbon-containing gases causes the growth of diamond structures on the patterned diamond layer 5, as seen in FIG. 2f.

Figure 3:
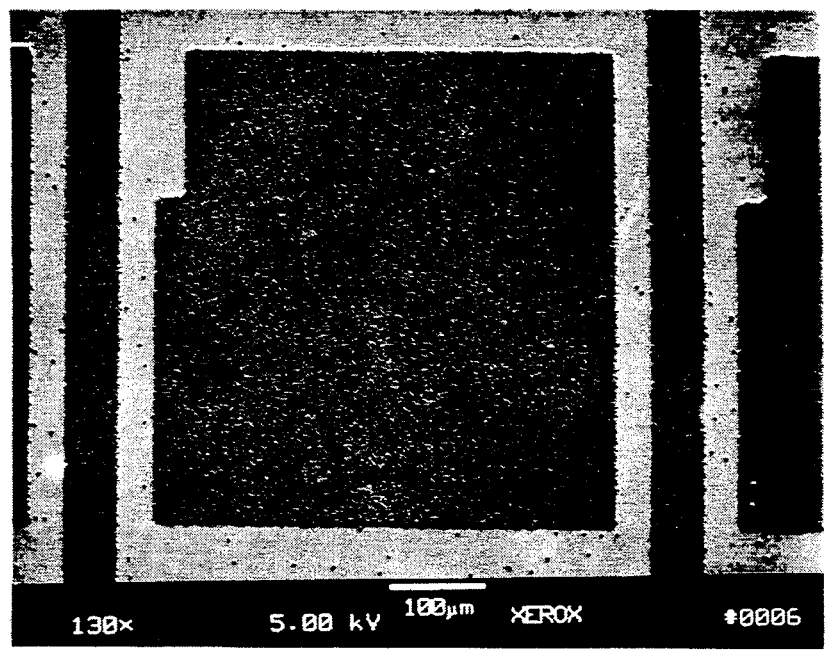
FIG. 3 is a scanning electron micrograph of a diamond film pattern on a substrate constructed according to the present invention.

Referring to FIG. 3, a scanning electron micrograph is shown. The scanning electron microscope has been used throughout for measuring dimensions of materials in the present invention. A diamond structure is shown having a high resolution. The diamond structure can have a thickness as small as 0.1 microns and larger than 1000 microns. Several steps can be taken in order to prevent diamond crystallization on the substrate in areas outside of the pattern. First of all, performing the method of the present invention in a clean room environment will prevent the deposition of particulate matter onto the substrate. Particulate matter may form nucleation centers for diamond crystallization. Also, it is important that there are no abrasions on the substrate surface. Abrasions in the substrate surface may also form nucleation centers for diamond crystallization. Extraneous diamond crystals can be removed using a second lift-off procedure. If the substrate 1 is made of silicon or a similar material, a protective layer such as silicon nitride or silicon oxide can be formed directly on the substrate I. This oxide or nitride layer is formed on the surface of the substrate 1 in the developed areas of the photoresist layer (See FIG. 1d). After diamond structures are formed on the diamond powder layer 5 (See FIG. 1f), the oxide or nitride layer can be removed, along with any extraneous diamond crystals, using any of a variety of well-known methods.

A continuous diamond thin film can be formed over the substrate 1 using the present invention. This is simply done by foregoing the exposing and development steps mentioned above. After the diamond powder layer has been formed on the photoresist layer, the photoresist layer is carbonized at a high temperature and etched away during the diamond deposition process.

In further embodiments of the present invention, the diamond powder layer can be incorporated in the photoresist layer. Also, the diamond powder layer can be placed underneath the photoresist layer. After the photoresist is developed, unwanted extraneous diamond particles can be etched away in any of a variety of well-known methods.

The above is a detailed description of a particular embodiment of the invention. The full scope of the invention is set out in the claims that follow and their equivalents. Accordingly, the claims and specification should not be construed to unduly narrow the full scope of protection to which the invention is entitled.

What is claimed is:

1. A method of forming a patterned, poly-crystalline diamond film on a substrate, comprising:

applying to a substrate a photoresist layer;

applying to said photoresist layer a diamond powder layer, said diamond powder layer including diamond particles;

exposing said photoresist layer and said diamond powder layer to electromagnetic radiation through a mask;

developing said photoresist layer sufficiently to form a developed photoresist layer;

heating the substrate, developed photoresist layer, and diamond powder layer in a processing apparatus, said heating step causing said developed photoresist layer to carbonize;

introducing a mixture of gases into said apparatus, said mixture of gases including carbon-containing and hydrogen-containing gases; and decomposing said mixture of gases in said apparatus, whereby hydrogen in said hydrogen-containing gases remove said carbonized photoresist layer, and whereby carbon in said carbon-containing gases combines with said diamond particles forming diamond structures on said substrate.

2. The method of claim wherein in said applying a diamond powder layer step, diamond powder is applied from a suspension thereof by spin coating.

3. The method of claim 1 wherein in said applying a diamond powder layer step, diamond powder is applied from a suspension thereof by dip coating.

4. The method of claim 1 wherein in said applying a diamond powder layer step, diamond powder is applied from a suspension thereof by spray coating.

5. The method of claim 1 wherein in said exposing step, said electromagnetic radiation is Ultra-Violet light.

6. The method of claim 1 wherein in said applying a diamond powder layer step, diamond particles are applied to the substrate in an amount of from about one to ten particles per square micron with an average particle diameter of from about 0.01 to about 0.4 microns.

7. The method of claim wherein said processing apparatus is a deposition chamber.

8. The method of claim 1 wherein said hydrogen-containing gas is diatomic hydrogen.

9. The method of claim 1 wherein in said heating step, the substrate is heated to a temperature from about 400° to about 900° C.

10. The method of claim 1 wherein the thickness of said diamond structures is from about 0.1 to about 1000 microns.

11. The method of claim 1 wherein in said introducing a mixture step, said mixture of gases includes carbon-containing gases in a concentration from about 0.1 to about 3 percent by volume.

12. A method of forming a patterned, poly-crystalline diamond film on a substrate, comprising:
    applying to a substrate a photoresist layer;
    exposing said photoresist layer to electromagnetic radiation through a mask;
    applying to said photoresist layer a diamond powder layer, said diamond powder layer including diamond particles;
    developing said photoresist layer sufficiently to form a developed photoresist layer;
    heating the substrate, developed photoresist layer, and diamond powder layer in a processing apparatus, said heating step causing said developed photoresist layer to carbonize;
    introducing a mixture of gases into said apparatus, said mixture of gases including carbon-containing and hydrogen-containing gases; and
    decomposing said mixture of gases in said apparatus, whereby said hydrogen-containing gases remove said carbonized photoresist layer, and whereby carbon in said carbon-containing gases combines with said diamond particles forming diamond structures on said substrate.

13. The method of claim 12 wherein in said applying a diamond powder layer step, diamond powder is applied from a suspension thereof by spin coating.

14. The method of claim 12 wherein in said applying a diamond powder layer step, diamond powder is applied from a suspension thereof by dip coating.

15. The method of claim 12 wherein in said applying a diamond powder layer step, diamond powder is applied from a suspension thereof by spray coating.

16. The method of claim 12 wherein in said exposing step, said electromagnetic radiation is Ultra-Violet light.

17. The method of claim 12 wherein in said applying a diamond powder layer step, diamond particles are applied to the substrate in an amount of from about one to ten particles per square micron with an average particle diameter of from about 0.01 to about 0.4 microns.

18. The method of claim 12 wherein said processing apparatus is a deposition chamber.

19. The method of claim 12 wherein said hydrogen-containing gas is diatomic hydrogen.

20. The method of claim 12 wherein in said heating step, the substrate is heated to a temperature from about 400° to about 900° C.

21. The method of claim 12 wherein the thickness of said diamond structures is from about 0.1 to about 1000 microns.

22. A method of forming a continuous, poly-crystalline diamond film on a substrate, comprising:
    applying to a substrate a photoresist layer;
    applying to said photoresist layer a diamond powder layer, said diamond powder layer including diamond particles;
    heating the substrate, photoresist layer, and diamond powder layer in a processing apparatus, said heating step causing said photoresist layer to carbonize;
    introducing a mixture of gases into said apparatus, said mixture of gases including carbon-containing and hydrogen-containing gases; and
    decomposing said mixture of gases in said apparatus, whereby said hydrogen-containing gases remove said carbonized photoresist layer, and whereby carbon in said carbon-containing gases combines with said diamond particles forming a diamond film on said substrate.

23. A method of forming a patterned, poly-crystalline diamond film on a substrate, comprising:
    applying a photoresist layer to a silicon substrate;
    applying to said photoresist layer a diamond powder layer, said diamond powder layer formed from diamond particles having an average diameter of 0.1 microns;
    exposing said photoresist layer and diamond powder layer to Ultra-Violet light through a mask;
    developing said photoresist layer sufficiently to form a developed photoresist layer;
    heating the substrate, developed photoresist layer, and diamond powder layer in a deposition chamber, said heating step causing said developed photoresist layer to carbonize;
    introducing a mixture of gases into said chamber, said mixture of gases including a diatomic hydrogen gas and a hydrocarbon gas; and
    decomposing said mixture of gases in said chamber, whereby hydrogen removes said carbonized photoresist layer, and whereby carbon in said hydrocarbon gas combines with said diamond particles forming diamond structures on said substrate.

* * * * *

UNITED STATES PATENT AND TRADEMARK OFFICE
CERTIFICATE OF CORRECTION

PATENT NO. : 5,204,210
DATED : April 20, 1993
INVENTOR(S) : Frank Jansen, et al

It is certified that error appears in the above-indentified patent and that said Letters Patent is hereby corrected as shown below:

| Column | Line | |
|---|---|---|
| 3 | 39 | Change "substrate" to --substrate 1--. |
| 4 | 30 | Before "pass" insert --to--. |
| 5 | 3 | Replace "than that of the" with --of the gas mixture, the remainder being the--. |
| 6 | 10 | Change "substrate I" to --substrate 1--. |
| 6 | 59 | Change "remove" to --removes--. |
| 7 | 13 | After "claim" insert --1--. |

Signed and Sealed this

Twenty-second Day of March, 1994

Attest:

BRUCE LEHMAN

Attesting Officer     Commissioner of Patents and Trademarks